(12) United States Patent
Miller et al.

(10) Patent No.: US 7,710,761 B2
(45) Date of Patent: May 4, 2010

(54) CMOS SRAM/ROM UNIFIED BIT CELL

(75) Inventors: Dennis Ray Miller, Chandler, AZ (US); Mohammad Hafijur Rahman, Gilbert, AZ (US); Mohammad Ehsanul Kabir, San Jose, CA (US)

(73) Assignee: VNS Portfolio LLC, Cupertino, CA (US)

( * ) Notice: Subject to any disclaimer, the term of this patent is extended or adjusted under 35 U.S.C. 154(b) by 0 days.

(21) Appl. No.: 11/652,726

(22) Filed: Jan. 12, 2007

(65) Prior Publication Data

US 2008/0170430 A1 Jul. 17, 2008

(51) Int. Cl.
*G11C 11/00* (2006.01)

(52) U.S. Cl. .............................. 365/154; 365/94; 365/96

(58) Field of Classification Search .................... 365/94, 365/96, 154
See application file for complete search history.

(56) References Cited

U.S. PATENT DOCUMENTS

| | | | | | |
|---|---|---|---|---|---|
| 4,855,803 | A | * | 8/1989 | Azumai et al. | 257/202 |
| 5,311,464 | A | * | 5/1994 | Takase et al. | 365/156 |
| 5,365,475 | A | * | 11/1994 | Matsumura et al. | 365/154 |
| 5,388,076 | A | * | 2/1995 | Ihara | 365/200 |
| 5,408,428 | A | * | 4/1995 | Burgess et al. | 365/94 |
| 5,432,742 | A | * | 7/1995 | Ihara et al. | 365/189.2 |
| 5,453,949 | A | | 9/1995 | Wiedmann et al. | |
| 5,455,788 | A | * | 10/1995 | Clark | 365/156 |
| 5,517,061 | A | * | 5/1996 | Azmanov | 257/758 |
| 5,880,999 | A | * | 3/1999 | Ansel et al. | 365/189.09 |
| 5,923,582 | A | * | 7/1999 | Voss | 365/154 |
| 6,128,218 | A | | 10/2000 | You et al. | |
| 6,222,216 | B1 | | 4/2001 | Rao et al. | 257/296 |
| 6,438,024 | B1 | * | 8/2002 | Gold et al. | 365/154 |
| 6,771,528 | B2 | * | 8/2004 | Jeung et al. | 365/94 |
| 6,822,889 | B2 | * | 11/2004 | Chen et al. | 365/94 |
| 6,826,073 | B2 | | 11/2004 | Liaw et al. | |
| 6,906,942 | B2 | * | 6/2005 | Ostermayr | 365/104 |
| 7,018,889 | B2 | * | 3/2006 | Porter et al. | 438/238 |
| 7,023,744 | B1 | * | 4/2006 | Shimanek et al. | 365/189.11 |
| 2006/0028853 | A1 | | 2/2006 | Osada et al. | 365/63 |

OTHER PUBLICATIONS

PCT/US08/00260, International Search Report dated May 27, 2009.
PCT/US08/00260, Written Opinion dated May 27, 2009.

* cited by examiner

*Primary Examiner*—Huan Hoang
(74) *Attorney, Agent, or Firm*—Henneman & Associates, PLC; Larry E. Henneman, Jr.

(57) ABSTRACT

A memory cell including a bit and bitnot sense lines as well as a random access memory (RAM) word line and a read only memory (ROM) word line. The memory cell particularly includes a static RAM (SRAM) bit cell and a ROM bit cell. The SRAM bit cell is coupled between the bit and bitnot sense lines, and is responsive to a signal on the RAM word line. The ROM bit cell is also coupled between the bit and bitnot sense lines, and is responsive to a signal on the ROM word line. The ROM bit cell includes first and second ROM pass transistors, a first node for permanently programming connection of the first ROM pass transistor to either a voltage line or a ground line, and a second node for permanently programming connection of the second ROM pass transistor to either the voltage line or the ground line.

16 Claims, 7 Drawing Sheets

CMOS SRAM/ROM UNIFIED BIT CELL

TECHNICAL FIELD

The present invention relates generally to information storage and retrieval systems, and more particularly to semiconductor storage elements including one or more transistors.

BACKGROUND ART

In general, current memory designs place static random access memory (SRAM) blocks and read only memory (ROM) blocks into completely separate arrays. These arrays then are not physically in proximity with each other and do not share the same basic cell layout. As a result of this, such SRAM blocks and ROM blocks typically have separate address decoding circuitry, output sensing and multiplexing circuitry, and timing circuitry. Some common adverse consequences of this are increased overall circuit complexity, footprint, and power consumption and dissipation.

Designs have now appeared where SRAM and ROM blocks use either common address decoding circuitry or shared sense amplifiers. Relatively recently, a few designs unify SRAM and ROM blocks in physical proximity in the same basic cell layout. These early unified designs, however, still have a number of disadvantages.

For example, U.S. Pat. No. 6,826,073 by Liaw et al. (hereinafter Liaw '073) teaches a combination cell that adds a seventh-transistor ROM circuit to an essentially conventional six-transistor SRAM circuit. The result here, unfortunately, has a number of limitations. For instance, the resulting memory cell has a single word line; a bit line and a bitnot line for its SRAM function (i.e., the conventional differential arrangement); and yet further has a third bit line for its ROM function. When the single word line of Liaw '073 is enabled both its SRAM and ROM functions are accessed together, and the storage states of both appear across the three bit lines. It then falls upon "down stream" circuitry that is necessarily provided and used here to sort out whether RAM or ROM has been read.

Another example of a unified bit cell design is seen in U.S. Pat. No. 6,128,218 by You et al. (hereinafter You '218). This teaches a hybrid memory device that includes an essentially conventional six-transistor SRAM circuit and a four-transistor ROM circuit. [You '218 also teaches a six-transistor SRAM and six-transistor 2xROM cell that is not relevant here.] Conforming with tradition, and thus unlike Liaw '073, You '218 employs only a differential bit and bitnot line arrangement for both its SRAM and ROM functions. For its SRAM function You '218 employs a RAM word line, but for its ROM function it employs both a ROM word line and a ROM activation line. Thus, You '218 uses at least twice the transistors that are used in conventional two-transistor ROM cells, and using cells of this type requires complex "up stream" address decoding circuitry.

Accordingly, there still remains a need for a unified SRAM/ROM cell that efficiently integrates physically into a same basic cell layout, without increasing the transistor count beyond that of discrete SRAM cell and ROM cell solutions, and that uses simple and essentially conventional bit and word line arrangements.

DISCLOSURE OF INVENTION

Accordingly, it is an object of the present invention to provide SRAM/ROM unified bit cell.

Briefly, a preferred embodiment of the present invention is a unified memory cell. Bit and bitnot sense lines, and a random access memory (RAM) word line as well as a read only memory (ROM) word line are provided. The unified memory cell unifies a static RAM (SRAM) bit cell and a ROM bit cell. The SRAM bit cell is coupled between the bit and bitnot sense lines, and it is responsive to a signal on the RAM word line. The ROM bit cell is also coupled between the bit and bitnot sense lines, and it is responsive to a signal on the ROM word line. The ROM bit cell particularly includes a first ROM pass transistor and a first node for permanently programming connection of this first ROM pass transistor to either of a voltage line or a ground line. The ROM bit cell further includes a second ROM pass transistor and a second node for permanently programming connection of this second ROM pass transistor to either of the voltage line or the ground line.

These and other objects and advantages of the present invention will become clear to those skilled in the art in view of the description of the best presently known mode of carrying out the invention and the industrial applicability of the preferred embodiment as described herein as illustrated in the figures of the drawings.

BRIEF DESCRIPTION OF THE DRAWINGS

The purposes and advantages of the present invention will be apparent from the following detailed description in conjunction with the appended figures of drawings in which.

In the various figures of the drawings, like references are used to denote like or similar elements or steps.

BEST MODE FOR CARRYING OUT THE INVENTION

Figure 1:
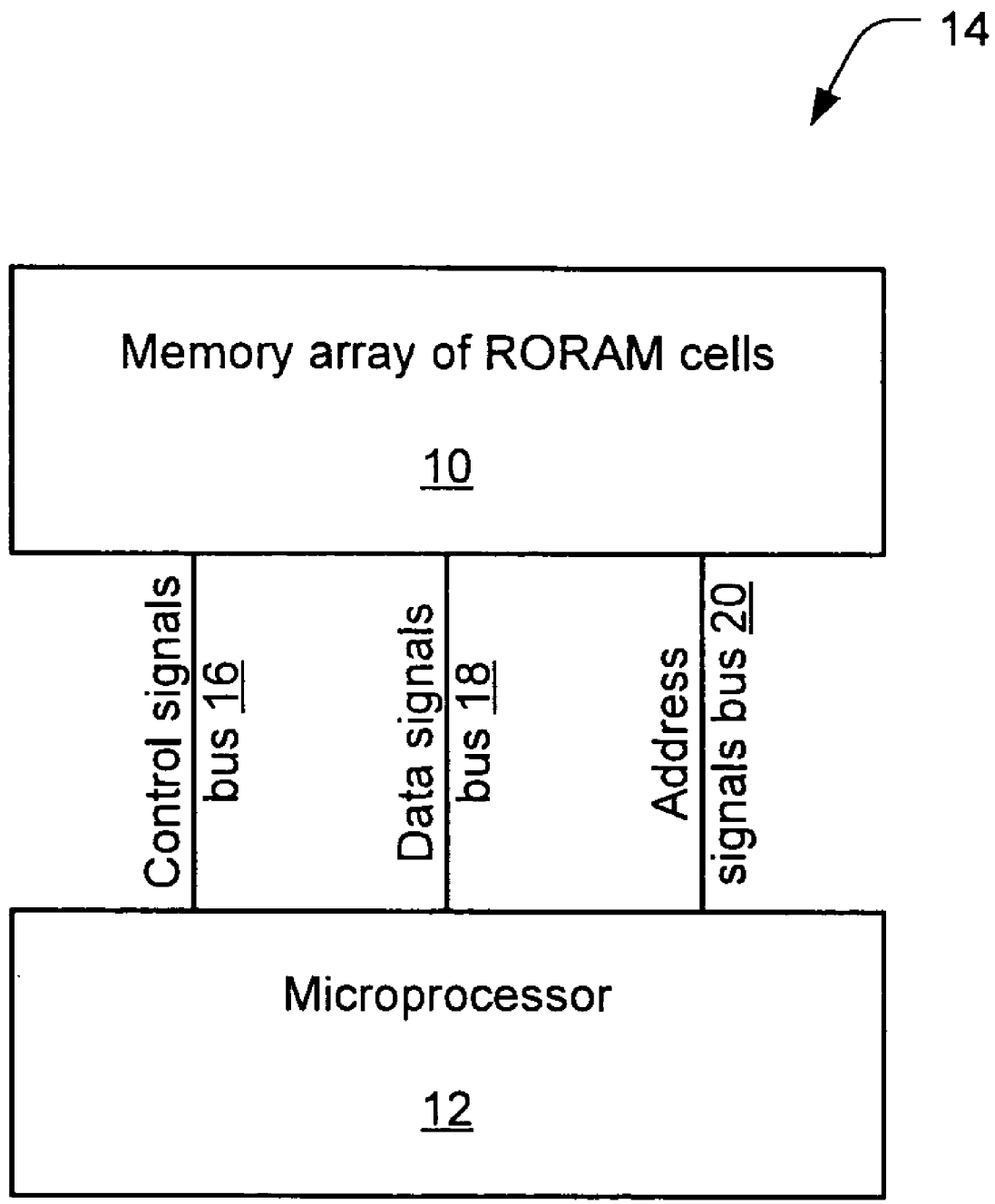
FIG. 1 is a block diagram depicting a read only random access memory (RORAM) in accord with the present invention being employed by a microprocessor in an exemplary integrated circuit application.

A preferred embodiment of the present invention is a CMOS SRAM/ROM unified bit cell. As illustrated in the various drawings herein, and particularly in the views of FIGS. 2-4, preferred embodiments of the invention are depicted by the general reference character 30.

For context, FIG. 1 is a block diagram depicting a read only random access memory (RORAM 10) in accord with the present invention being employed by a microprocessor 12 in an exemplary integrated circuit application 14. The RORAM 10 and the microprocessor 12 communicate via a control signals bus 16, a data signals bus 18, and an address signals bus 20.

Figure 2:
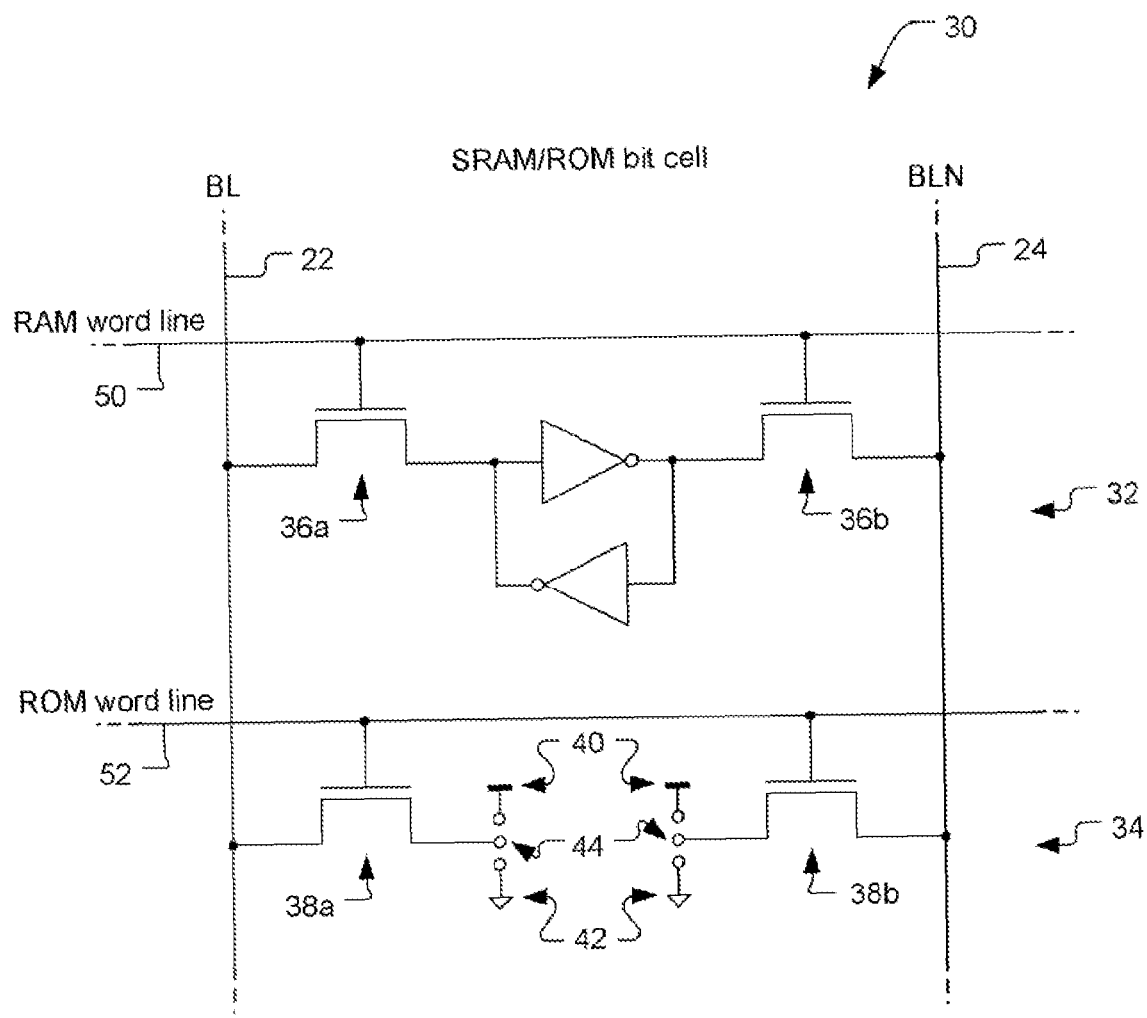
FIG. 2 is a schematic diagram depicting a SRAM/ROM bit cell in accord with the present invention, that is, a depiction of a cell as used in the RORAM in FIG. 1.

FIG. 2 is a schematic diagram depicting a SRAM/ROM bit cell 30 in accord with the present invention, that is, showing a cell used in the RORAM 10 in FIG. 1. The SRAM/ROM bit cell 30 includes a SRAM bit cell 32, which can generally be a conventional six transistor type (see also FIGS. 3 and 4). The SRAM/ROM bit cell 30 additionally includes a ROM bit cell 34 which, as shown here (and in FIGS. 3 and 4), can generally be a conventional two transistor type.

The SRAM bit cell 32 particularly includes pass transistors 36a-b (as shown) and the ROM bit cell 34 particularly includes pass transistors 38a-b (as shown). The pass transistors 36a-b, 38a-b here are essentially identical, but with the pass transistors 38a-b of the ROM bit cell 34 strapped to Vdd/Vss 40 or ground 42 at programming nodes 44 for bit programming. The physical layouts the SRAM bit cell 32 and the ROM bit cell 34 are thus substantially the same. The SRAM bit cell 32 and the ROM bit cell 34 are commonly connected to a bit sense line 46 (BL) and a bitnot sense line 48 (BLN), and a unique RAM word line 50 and a unique ROM word line 52 are provided, as shown.

As discussed in the Background Art section, above, RAM type memories have traditionally had such peripheral circuitry as they needed, and ROM type memories have separately had such peripheral circuitry as they needed. It has been the present inventors' observation that this is illogical and often quite wasteful, e.g., of circuit footprint, materials, power, and design resources to deal with the redundancy.

Figure 3:
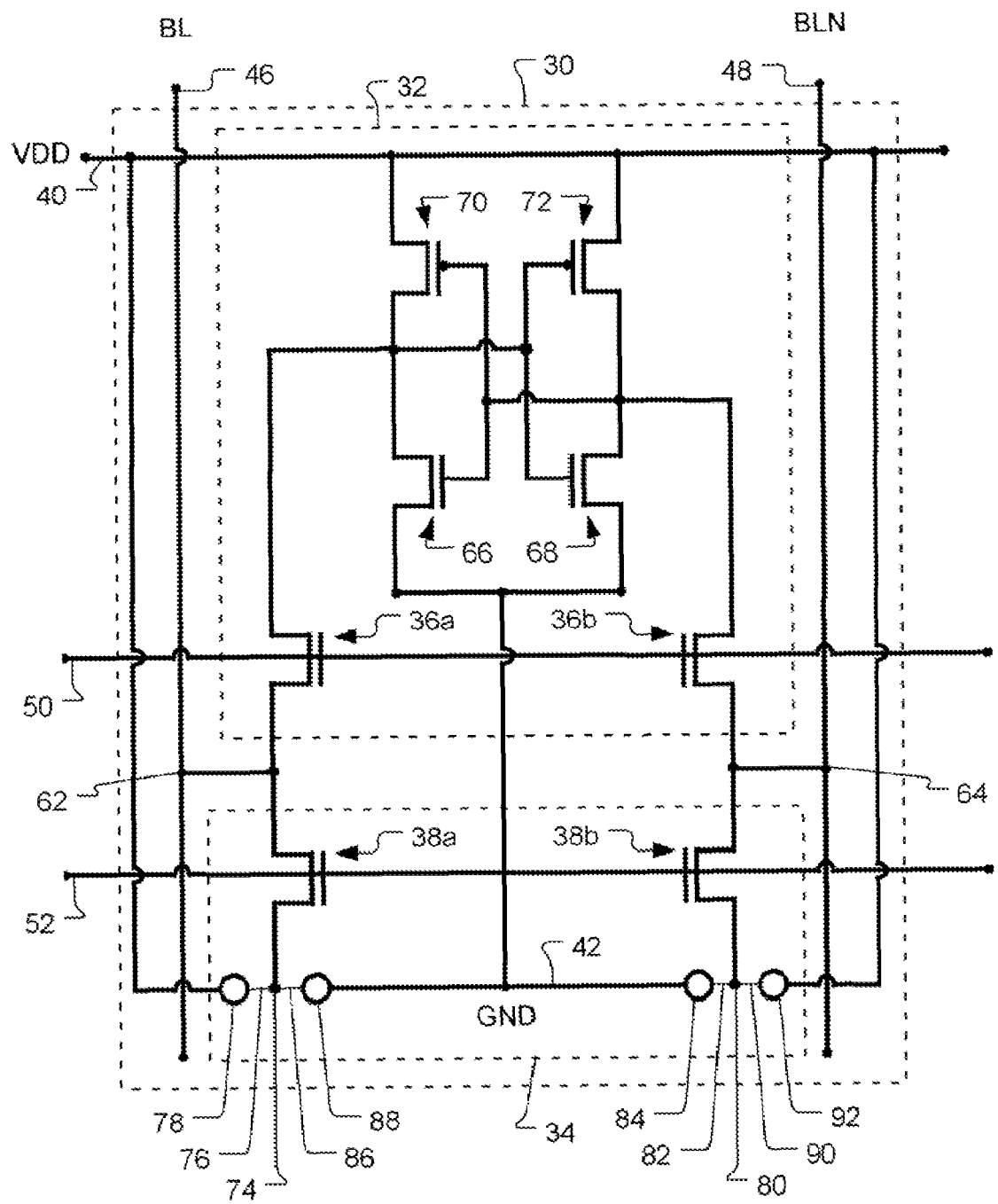
FIG. 3 is another schematic diagram of the SRAM/ROM bit cell of FIG. 2, here showing more detail and presenting the inventors' presently preferred embodiment.

FIG. 3 is another schematic diagram of the SRAM/ROM bit cell 30, here one with more detail and that is in accord with the inventors' presently preferred embodiment. Those skilled in the art will appreciate that the schematic diagram in FIG. 3 is a straightforward extension of the conceptual schematic diagram in FIG. 2. Dashed-line blocks show the SRAM/ROM bit cell 30, the SRAM bit cell 32, and the ROM bit cell 34. Again, a static random access memory bit cell (SRAM bit cell 32) is combined with a read only memory bit cell (ROM bit cell 34) and these cells share a common data bit line (the bit sense line 46 (BL)) and its complementary data bit not line (the bitnot sense line 48 (BLN)). The bit sense line 46 and the bitnot sense line 48 form a differential bit line. When the SRAM/ROM bit cell 30 is read, by enabling either the RAM word line 50 or the ROM word line 52, a high voltage at the bit sense line 46 and a low voltage at the bitnot sense line 48 will represent a binary one value and, conversely, a low voltage at the bit sense line 46 and a high voltage at the bitnot sense line 48 will represent a binary zero value. The representations of binary one value and binary zero value can also be represented by a low voltage at the bit sense line 46 and a high voltage at the bitnot sense line 48 to represent a binary one value and, conversely, a high voltage at the bit sense line 46 and a low voltage at the bitnot sense line 48 to represent a binary zero value.

Figure 4:
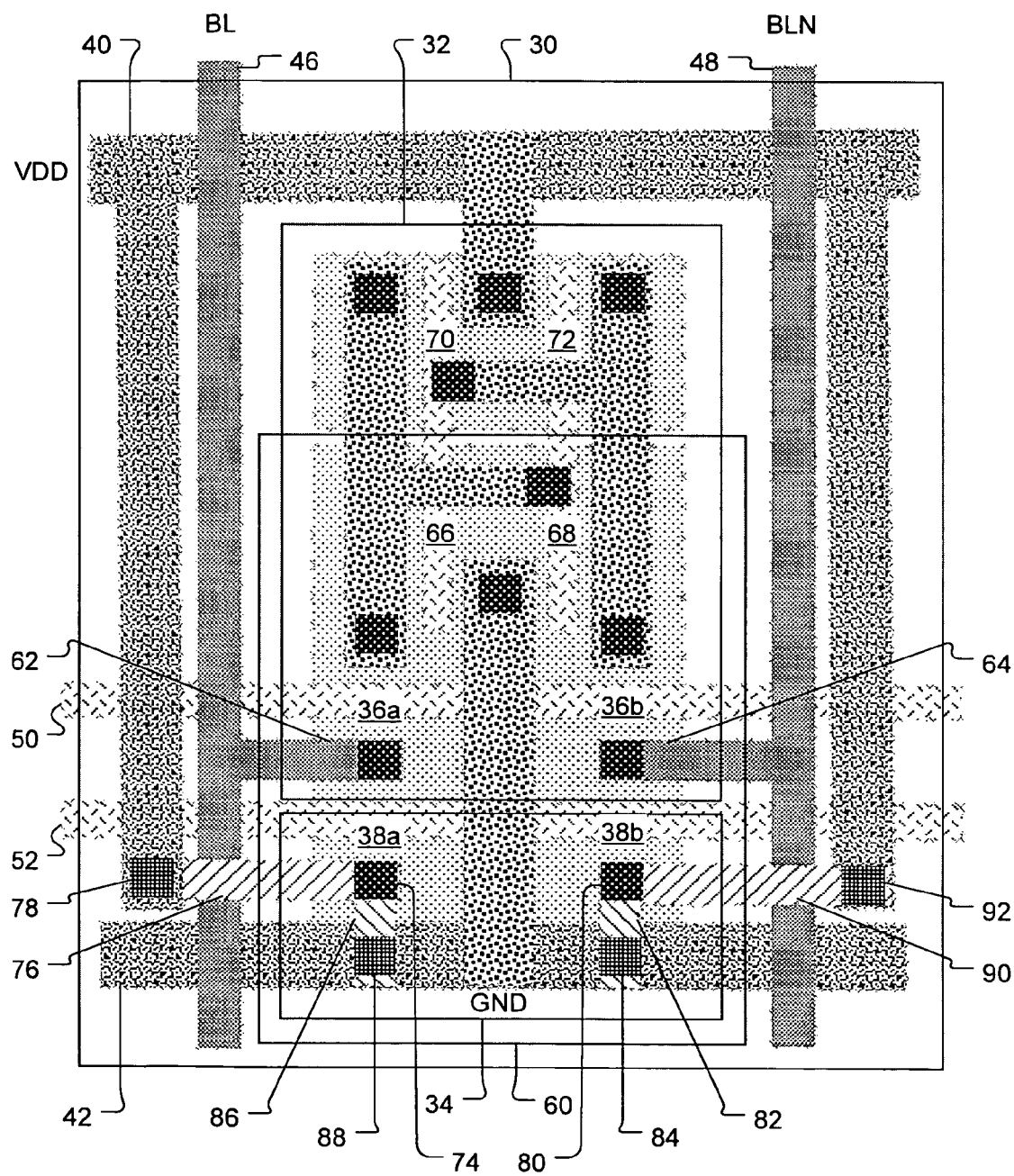
FIG. 4 is a physical layout diagram of the embodiment of the SRAM/ROM bit cell shown in FIG. 3.

FIG. 4 is a physical layout diagram of the embodiment of the SRAM/ROM bit cell 30 shown in FIG. 3. Here solid-line blocks show the SRAM/ROM bit cell 30, the SRAM bit cell 32, the ROM bit cell 34, and also a common p-substrate or p-well region 60 shown in FIG. 4. The p-well region 60 includes nMOS instances of the pass transistors 36a and 38a sharing a common drain 62 that connects to the bit sense line 46, and the p-well region 60 also includes nMOS instances of the pass transistors 36b and 38b sharing a common drain 64 that connects to the bitnot sense line 48. Combining the bit cells 32,34 in this arrangement results in a smaller physical memory layout.

The nMOS transistors 66,68 and the pMOS transistors 70,72 comprise a latch for the SRAM bit cell 32. The nMOS pass transistors 36a, 36b are the pass transistors used to connect the SRAM bit cell 32 to the bit sense line 46 and the bitnot sense line 48 when the SRAM bit cell 32 is read or written to. This configuration of transistors 36a-b,66,68,70, 72 is a classic six transistor ("6T") static random access memory ("SRAM") bit cell.

The SRAM bit cell 32 of the SRAM/ROM bit cell 30 is read by the microprocessor 12 (FIG. 1) by applying a voltage to the poly silicon RAM word line 50. This turns on the nMOS pass transistor 36a which drives the bit sense line 46 with the voltage value that is present in the SRAM bit cell 32 (transistors 66,68,70,72), driven by either the nMOS transistor 66 or the pMOS transistor 70, and the nMOS pass transistor 36b turns on which drives the bitnot sense line 48 with the voltage value that is present in the SRAM bit cell 32 (transistors 66,68,70,72), driven by either the nMOS transistor 68 or the pMOS transistor 72.

The ROM bit cell 34 of the SRAM/ROM bit cell 30 is read by the microprocessor 12 (FIG. 1) by applying a voltage to the poly silicon ROM word line 52. This turns on the nMOS pass transistor 38a which drives the bit sense line 46 with the voltage value of either Vdd/Vss 40 or ground 42 and turns on the nMOS pass transistor 38b which drives the bitnot sense line 48 with the voltage value of either ground 42 or Vdd/Vss 40 that is the inverse of what is driven on the bit sense line 46.

One approach to programming the ROM bit cell 34 to a particular data value is to use vias to connect metal straps already provided in the physical layout from the sources of the nMOS pass transistors 38a-b to Vdd/Vss 40 and ground 42, respectively. For example, if the ROM bit cell 34 is to be programmed to a data value of one the source 74 of the nMOS pass transistor 38a connects to a metal strap 76, so a via 78 is added to connect the metal strap 76 to Vdd/Vss 40. Similarly, the source 80 of the nMOS pass transistor 38b connects to a metal strap 82, so a via 84 is added to connect the metal strap 82 to ground 42. Conversely, if the ROM bit cell 34 is to be programmed to a data value of zero the source 74 also connects to a metal strap 86, so a via 88 is added to connect the metal strap 86 to ground 42. And similarly, the source 80 of the nMOS pass transistor 38b also connects to a metal strap 90, so a via 92 is added to connect the metal strap 90 to Vdd/Vss 40.

An alternate approach to programming the ROM bit cell 34 to a data value can use insertion of particular of the metal straps 76,82,86,90 with instances of the vias 78,84,88,92 that are already present in the physical layout. For example, if the ROM bit cell 34 is programmed to a data value of one, the metal strap 76 is inserted to connect the source 74 of the nMOS pass transistor 38a to Vdd/Vss 40, and the metal strap 82 is inserted to connect the source 80 of the nMOS pass transistor 38b to ground 42.

Figure 5:
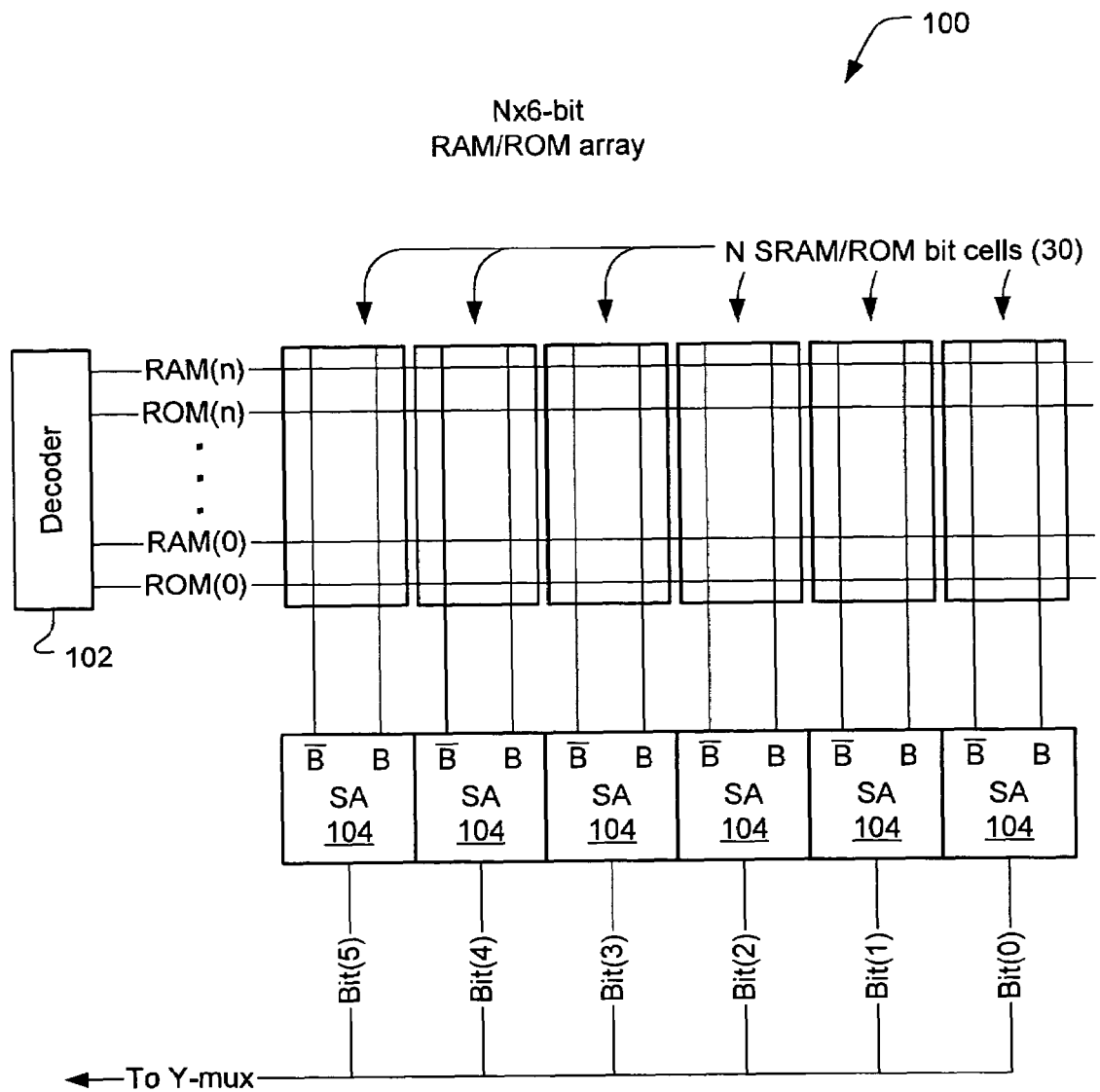
FIG. 5 is a schematic diagram depicting an N×6 array that includes a plurality of the SRAM/ROM bit cells of FIG. 2.

FIG. 5 is a schematic diagram depicting an N×6 array 100 that includes a plurality of the SRAM/ROM bit cells 30 of FIG. 2. As can be observed here, a major benefit in memories constructed with the inventive SRAM/ROM bit cell 30 is that the respective SRAM bit cells 32 and the ROM bit cells 34 can share peripheral circuitry. The N×6 array 100 here shares a common address decoder 102 and common sense amplifiers 104.

Figure 6:
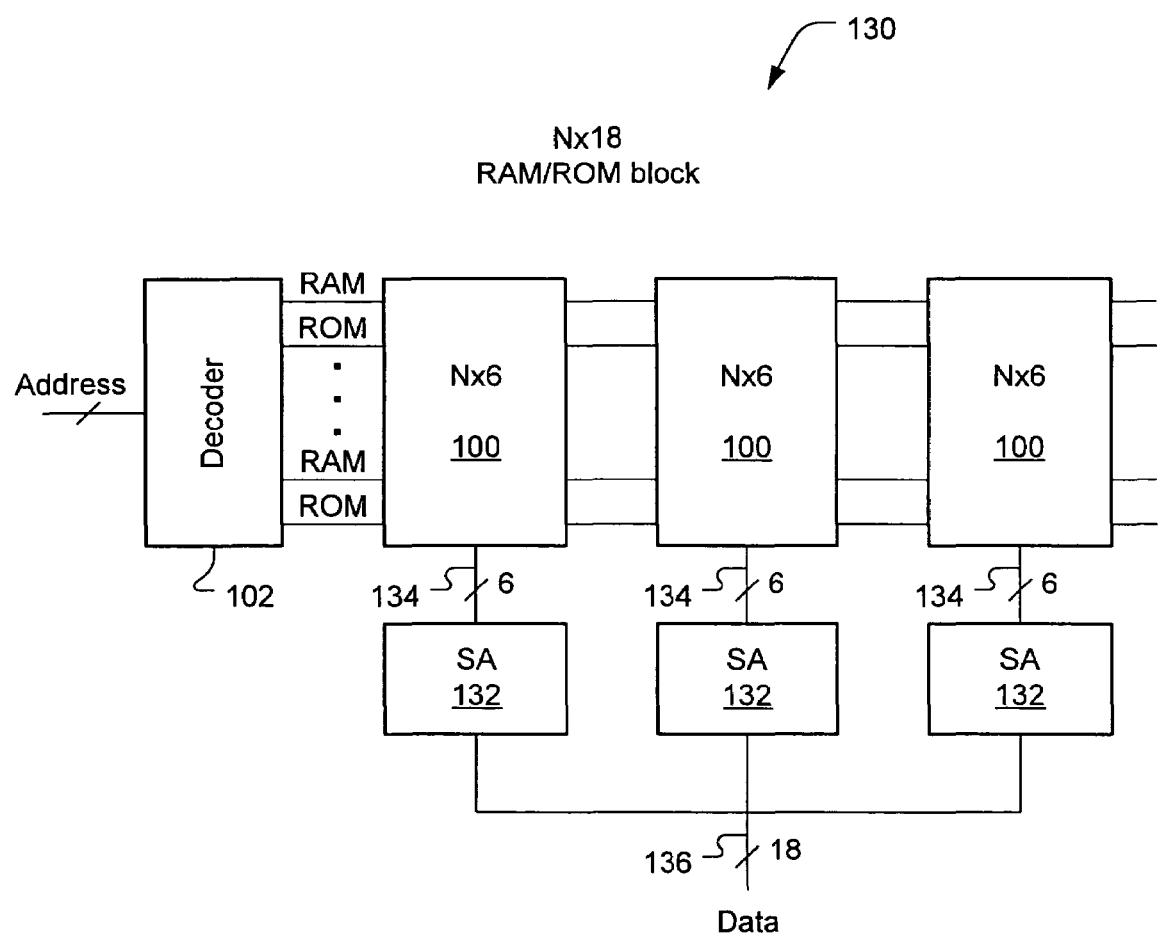
FIG. 6 is a schematic diagram depicting an N×18 block that includes three of the N×6 arrays of FIG. 5, as well as common peripheral circuitry.

FIG. 6 is a schematic diagram depicting an N×18 block 130 that includes three of the N×6 arrays 100 of FIG. 5, as well as the common address decoder 102 again and now three sense amp blocks 132 (e.g., each including a set of six of the sense amplifiers 104 of FIG. 5).

FIG. 6 further illustrates reducing circuit redundancy. Less obvious, however, is that having the SRAM bit cell 32 and ROM bit cell 34 in the same physical SRAM/ROM bit cell 30 simplifies the control circuitry in other respects. For example, since the read access times for both the SRAM bit cells 32 and the ROM bit cells 34 are identical, there only needs to be one timing circuit supplying both (i.e., in the common address decoder 102 here). Unlike prior art approaches, when the inventive SRAM/ROM bit cells 30 are used memory access results will inherently appear in synchronization on array buses 134 and on a block bus 136.

Figure 7:
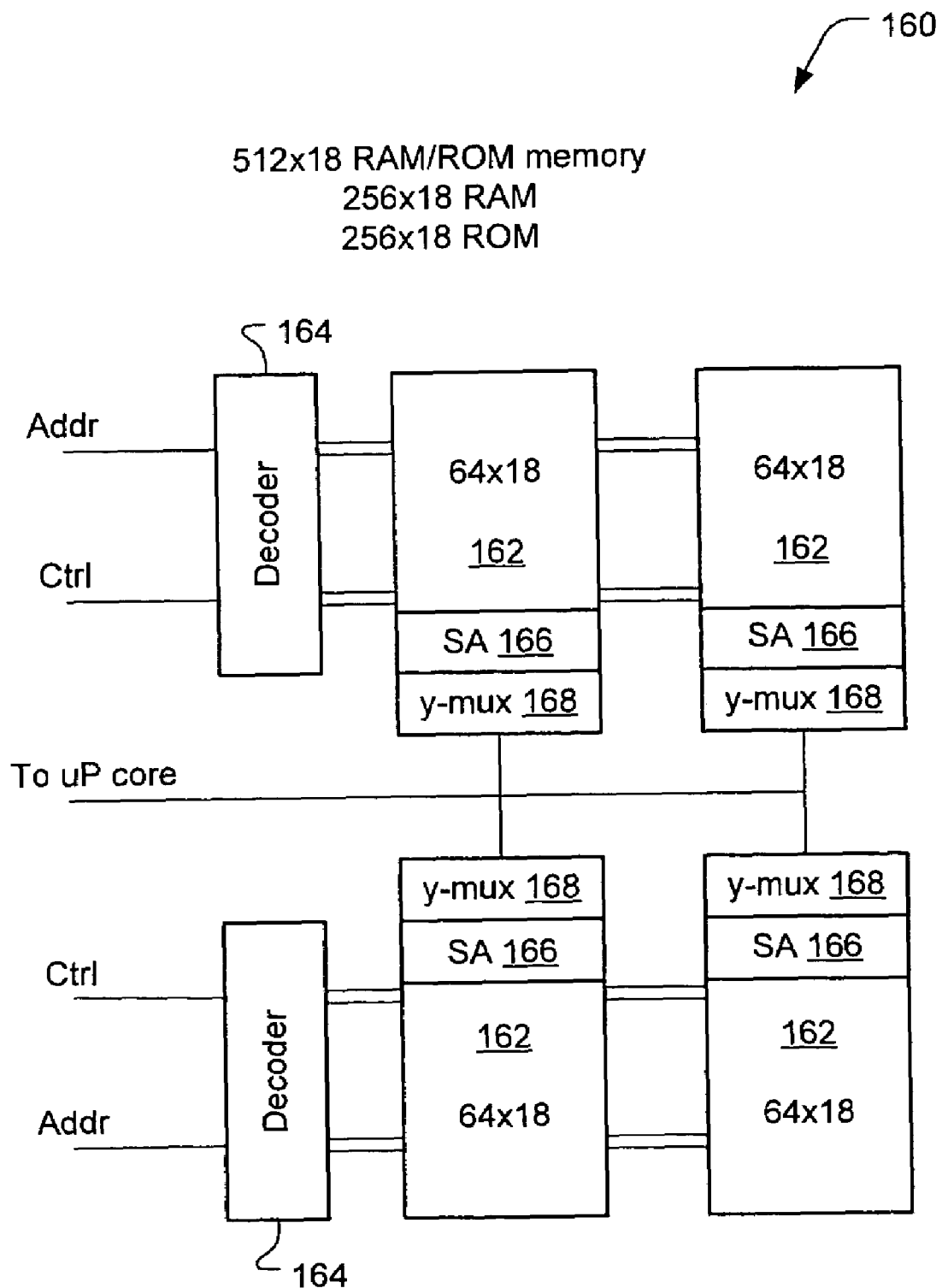
FIG. 7 is a schematic diagram depicting a 512×18 memory that includes four 64×18 blocks (e.g., each including a set of four of the N×18 blocks of FIG. 6 where N=64) as well as peripheral circuitry.

FIG. 7 is a schematic diagram depicting a 512×18 memory 160 that includes four 64×18 blocks 162 (e.g., each including a set of four of the N×18 blocks 130 of FIG. 6 where N=64), two address decoders 164, and a sense amp unit 166 and y-mux circuitry 168 for each of the respective 64×18 blocks 162. The salient point here is that large memories can easily be constructed using the SRAM/ROM bit cells 30, leveraging the benefits that the inventive SRAM/ROM bit cells 30 provide to reduce circuit complexity, footprint, power consumption, etc.

While various embodiments have been described above, it should be understood that they have been presented by way of example only, and that the breadth and scope of the invention should not be limited by any of the above described exemplary embodiments, but should instead be defined only in accordance with the following claims and their equivalents.

What is claimed is:

1. A memory device, comprising:
    a bit sense line and a bitnot sense line;
    a random access memory (RAM) word line and a read only memory (ROM) word line;
    a static RAM (SRAM) bit cell coupled between said bit sense line and said bitnot sense line and responsive to a signal on said RAM word line, said SRAM bit cell including a first RAM pass transistor and a second RAM pass transistor;
    a ROM bit cell coupled between said bit sense line and said bitnot sense line and responsive to a signal on said ROM word line; and
    said ROM bit cell including a first ROM pass transistor, a second ROM pass transistor, a first node permanently coupling said first ROM pass transistor to one of a voltage line and a ground line, and a second node permanently coupling said second ROM pass transistor to the other of said voltage line and said ground line, according to programmed data of the ROM bit cell; and wherein
    said first RAM pass transistor, said second RAM pass transistor, said first ROM pass transistor, and said second ROM pass transistor share a common well region;
    said first RAM pass transistor and said first ROM pass transistor share a common first terminal connection to said bit sense line; and
    said second RAM pass transistor and said second ROM pass transistor share a common second terminal connection to said bitnot sense line.

2. The memory device of claim 1, wherein:
    said SRAM bit cell is a conventional six-transistor type.

3. The memory device of claim 1, wherein:
    said first RAM pass transistor, said second RAM pass transistor, said first ROM pass transistor, and said second ROM pass transistor are substantially identical.

4. The memory device of claim 1, wherein:
    said first RAM pass transistor, said second RAM pass transistor, said first ROM pass transistor, and said second ROM pass transistor are n-type metal oxide semiconductor (nMOS) devices;
    said well region is a p-well region of p-type material;
    said first terminal connection connects a drain of said first RAM pass transistor and a drain of said first ROM pass transistor; and
    said second terminal connection connects a drain of said second RAM pass transistor and a drain of said second ROM pass transistor.

5. The memory device of claim 1, wherein:
    said first node includes a first via programmatically added to connect a terminal of said first ROM pass transistor to either one of said voltage line and said ground line;
    said second node includes a second via programmatically added to connect a terminal of said second ROM pass transistor to either one of said voltage line and said ground line; and
    wherein said first node thus connects to said voltage line and said second node connects to said ground line to program said ROM bit cell with a first valid memory state or said first node thus connects to said ground line and said second node connects to said voltage line to program said ROM bit cell with a second valid memory state.

6. The memory device of claim 5, wherein:
    said first ROM pass transistor and said second ROM pass transistor are n-type metal oxide semiconductor (nMOS) devices; and
    said terminal of said first ROM pass transistor is a source and said terminal of said second ROM pass transistor is a source.

7. The memory device of claim 1, wherein:
    said first node includes a first conductive strap programmatically added to connect a terminal of said first ROM pass transistor to either one of said voltage line and said ground line;
    said second node includes a second conductive strap programmatically added to connect a terminal of said second ROM pass transistor to either one of said voltage line and said ground line; and
    wherein said first node thus connects to said voltage line and said second node connects to said ground line to program said ROM bit cell with a first valid memory state or said first node thus connects to said ground line and said second node connects to said voltage line to program said ROM bit cell with a second valid memory state.

8. The memory device of claim 7, wherein:
    said first ROM pass transistor and said second ROM pass transistor are n-type metal oxide semiconductor (nMOS) devices; and
    said terminal of said first ROM pass transistor is a source and said terminal of said second ROM pass transistor is a source.

9. A memory device, comprising:
    means for differentially sensing a memory state of a memory cell of the memory device;
    means for accessing a RAM bit storage of the memory cell;
    means for accessing a ROM bit storage of the memory cell;
    means for providing said RAM bit storage of the memory cell, wherein said means for providing said RAM bit storage of the memory cell includes a first RAM pass transistor and a second RAM pass transistor, is coupled between said means for differentially sensing a memory state of the memory cell and is responsive to said means for accessing the RAM bit storage of the memory cell;
    means for providing said ROM bit storage of the memory cell, wherein said means for providing said ROM bit storage of the memory cell is coupled between said means for differentially sensing a memory state of the memory cell and is responsive to said means for accessing the ROM bit storage of the memory cell;

said means for providing said ROM bit storage of the memory cell including a first ROM pass transistor, a second ROM pass transistor, a first programming means for permanently coupling said first ROM pass transistor to one of a voltage line and a ground line, and a second programming means for permanently coupling said second ROM pass transistor to the other of said voltage line and said ground line, according to programmed data of the ROM bit cell; and wherein said first RAM pass transistor, said second RAM pass transistor, said first ROM pass transistor, and said second ROM pass transistor share a common well region;

said first RAM pass transistor and said first ROM pass transistor share a common first connection means to connect to said means for differentially sensing a memory state of the memory cell; and said second RAM pass transistor and said second ROM pass transistor share a common second connection means to connect to said means for differentially sensing a memory state of the memory cell.

10. The memory device of claim 9, wherein:
said means for providing said RAM bit storage of the memory cell includes a conventional six-transistor type RAM circuit.

11. The memory device of claim 9, wherein:
said first RAM pass transistor, said second RAM pass transistor, said first ROM pass transistor, and said second ROM pass transistor are substantially identical.

12. The memory device of claim 9, wherein:
said first RAM pass transistor, said second RAM pass transistor, said first ROM pass transistor, and said second ROM pass transistor are n-type metal oxide semiconductor (nMOS) devices;

said well region is a p-well region of p-type material;

said first connection means connects a drain of said first RAM pass transistor and a drain of said first ROM pass transistor; and said second connection means connects a drain of said second RAM pass transistor and a drain of said second ROM pass transistor.

13. The memory device of claim 9, wherein:
said first programming means includes a first via programmatically added to connect a terminal of said first ROM pass transistor to either one of said voltage line and said ground line;

said second programming means includes a second via programmatically added to connect a terminal of said second ROM pass transistor to either one of said voltage line and said ground line; and wherein said first programming means thus connects said first ROM pass transistor to said voltage line and said second programming means connects said second ROM pass transistor to said ground line to program said ROM bit storage means with a first valid memory state or said first programming means thus connects said first ROM pass transistor to said ground line and said second programming means connects said second ROM pass transistor to said voltage line to program said ROM bit storage means with a second valid memory state.

14. The memory device of claim 13, wherein:
said first ROM pass transistor and said second ROM pass transistor are n-type metal oxide semiconductor (nMOS) devices; and said terminal of said first ROM pass transistor is a source and said terminal of said second ROM pass transistor is a source.

15. The memory device of claim 9, wherein:
said first programming means includes a first conductive strap programmatically added to connect a terminal of said first ROM pass transistor to either one of said voltage line and said ground line;

said second programming means includes a second conductive strap programmatically added to connect a terminal of said second ROM pass transistor to either one of said voltage line and said ground line; and wherein said first programming means thus connects said first ROM pass transistor to said voltage line and said second programming means connects said second ROM pass transistor to said ground line to program said ROM bit storage means with a first valid memory state or said first programming means thus connects said first ROM pass transistor to said ground line and said second programming means connects said second ROM pass transistor to said voltage line to program said ROM bit storage means with a second valid memory state.

16. The memory device of claim 15, wherein:
said first ROM pass transistor and said second ROM pass transistor are n-type metal oxide semiconductor (nMOS) devices; and said terminal of said first ROM pass transistor is a source and said terminal of said second ROM pass transistor is a source.

* * * * *